United States Patent
Wu et al.

(10) Patent No.: US 8,646,175 B2
(45) Date of Patent: Feb. 11, 2014

(54) METHOD FOR MAKING A CONDUCTIVE FILM/PLATE EXIBITING ELECTRIC ANISOTROPY

(75) Inventors: Jeah-Sheng Wu, Miao-Li County (TW); Jia-Shyong Cheng, Miao-Li County (TW); Chih-Han Chao, Miao-Li County (TW)

(73) Assignee: Chimei Innolux Corporation, Miao-Li County (TW)

( * ) Notice: Subject to any disclaimer, the term of this patent is extended or adjusted under 35 U.S.C. 154(b) by 294 days.

(21) Appl. No.: 12/826,582

(22) Filed: Jun. 29, 2010

(65) Prior Publication Data

US 2011/0005816 A1 Jan. 13, 2011

(30) Foreign Application Priority Data

Jul. 7, 2009 (CN) .......................... 2009 1 0304083

(51) Int. Cl.
*H05K 3/02* (2006.01)
*H05K 3/10* (2006.01)
(52) U.S. Cl.
USPC ................ 29/846; 29/830; 156/229; 977/750
(58) Field of Classification Search
USPC ................. 29/830, 846, 851; 156/229, 172.8; 118/718; 174/256, 156; 423/447.1, 423/447.2, 447.3; 427/255.28, 350, 384; 428/297.4, 408; 977/742, 750, 842; 116/718
See application file for complete search history.

(56) References Cited

U.S. PATENT DOCUMENTS

| | | | | |
|---|---|---|---|---|
| 6,957,993 | B2 * | 10/2005 | Jiang et al. | 445/49 |
| 7,744,793 | B2 * | 6/2010 | Lemaire et al. | 977/842 |
| 2004/0053780 | A1 | 3/2004 | Jiang et al. | |
| 2005/0209392 | A1 | 9/2005 | Luo et al. | |

FOREIGN PATENT DOCUMENTS

| | | |
|---|---|---|
| EP | 2138998 A2 | 12/2009 |
| WO | 2007015710 A2 | 2/2007 |

OTHER PUBLICATIONS

Mei Zhang et al: "Strong, Transparent, Multifunctional, Carbon Nanotube Sheets" Science, American Association for the Advancement of Science, Washington, DC; US LNKD-DOI:10.1126/SCIENCE.1115311, vol. 2.9, Aug. 19, 2005, pp. 1215-1219, XP002520232,ISSN:0036-8075.

(Continued)

*Primary Examiner* — Donghai D Nguyen
(74) *Attorney, Agent, or Firm* — WPAT, PC; Justin King

(57) ABSTRACT

A method for making a conductive film exhibiting electric anisotropy comprises forming a nanomaterial on a substrate, the nanomaterial having a cluster of interconnected nanounits, each of which being substantially transverse to the substrate and having one end bonded to the substrate. The method further includes stretching the nanounits along a first direction to remove the nanomaterial from the substrate so as to form a conductive film having strings of interconnected nanounits, where the nanounits of the strings substantially extend in the first direction. A conductive plate and a method for making the same is also disclosed, where the method further comprises attaching the conductive film to a second substrate.

11 Claims, 6 Drawing Sheets

(56) References Cited

OTHER PUBLICATIONS

Chen Luzhuo et al: "Auxetic materials with large negative Poisson as rations based on highly oriented carbon nanotube structures" Applied Physics Letters, AIP, American Institute of Physics, Melville, NY, US LNKD-DOI:10.163/1.3159467, vol. 94, No. 25, Jun. 25, 2009, pp. 253111-253111, XP012121817, ISSN:0003-6951.

Wei Yang et al: "Efficient fabrication of field electron emitters from the multiwalled carbon nanotube yarns" Applied Physics Letters, AIP, American Institute of Physics, Melville, NY, US LNKE-DOI:10.1063/1.2236465, vol. 89, No. 6, Aug. 7, 2006, pp. 63101-063101, XP012088409, ISSN: 0003-6951.

Xiaobo Zhang et al: "Spinning and Processing Continuous Yarns from 4-inch Wafer Scale Super-Aligned Carbon Nanotube Arrays" Advanced Materials, Wiley VCH Verlag, DE LNKD-DOI:10.1002/ADMA.200502528, vol. 18, Jan. 1, 2006, pp. 1505-1510, XP002543229, ISSN:0935-9648.

* cited by examiner

METHOD FOR MAKING A CONDUCTIVE FILM/PLATE EXIBITING ELECTRIC ANISOTROPY

BACKGROUND

1. Technical Field

The present disclosure relates to a method for making a conductive film and a a conductive plate, and more particularly to a method involving removing a nanomaterial from a substrate and stretching the nanomaterial so as to form a conductive film exhibiting electric anisotropy.

2. Description of Related Art

Transparent conductive plates having transmittance and conductivity are widely used in flat panel displays (FPD), such as liquid crystal displays (LCD) or touch panels.

Generally, a conductive plate has a transparent substrate made from glass or polyethylene terephthalate (PET), and a transparent conductive film (TCF) formed thereon. The transparent conductive film (TCF) is normally formed by sputtering techniques, and can be made from indium tin oxide (ITO), tin oxide ($SnO_2$), or zinc oxide (ZnO). Among them, ITO is best qualified for commercial use in manufacturing the conductive plate by virtue of its high transmittance and high conductivity. Manufacture of large size conductive plates requires an expensive large size sputtering or deposition reactor for forming the ITO film on the transparent substrate. In addition, the control of forming a uniform thickness of the ITO film is very difficult when the size of the ITO film to be formed is large. Hence, there is a need in the art to provide a method for making a large size transparent conductive film without the need of a large size sputtering or deposition reactor.

SUMMARY OF THE INVENTION

According to one aspect of this disclosure, there is provided a method for making a conductive film exhibiting electric anisotropy that comprises (A) forming a nanomaterial on a substrate, the nanomaterial having a cluster of interconnected nanounits, each of the nanounits being substantially transverse to the substrate and having one end bonded to the substrate; and (B) stretching the nanounits along a first direction to remove the nanomaterial from the substrate so as to form a conductive film having strings of interconnected nanounits, and stretching the strings of the interconnected nanounits, wherein the nanounits of the strings substantially extend in the first direction.

According to another aspect of this disclosure, there is provided a method for making a conductive plate that comprises (a) stretching a nanomaterial to move the nanomaterial so as to form a conductive film exhibiting electric anisotropy; and (b) attaching the conductive film to a second substrate.

According to yet another aspect of this disclosure, there is provided a conductive plate that comprises a substrate; and a conductive film attached to the substrate and exhibiting electric anisotropy. The conductive film is formed by stretching a nanomaterial, which is removed from another substrate on which the nanomaterial is deposited.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe various embodiments in detail.

Figure 1A:
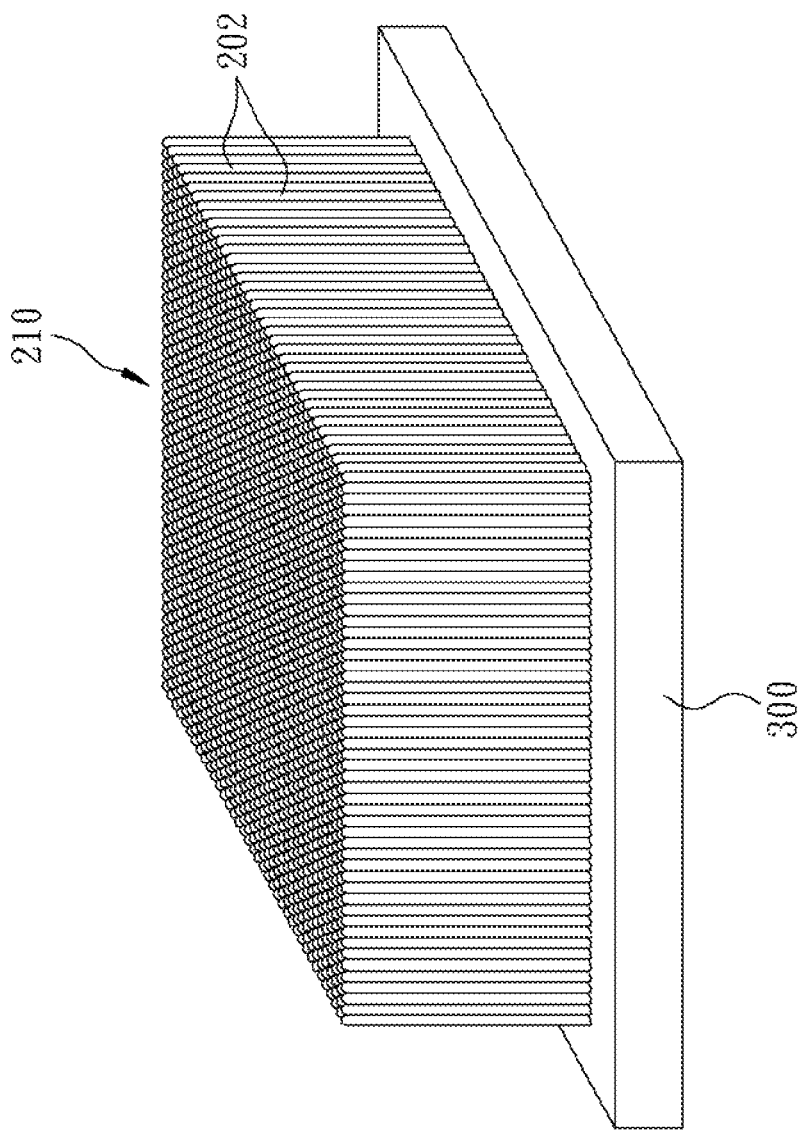
FIG. 1A is a perspective view of an exemplary embodiment of a conductive film of the present disclosure with a scanning electron microscope (SEM) cross-sectional image illustrating the structure of a nanomaterial formed on a first substrate.
Figure 1B:
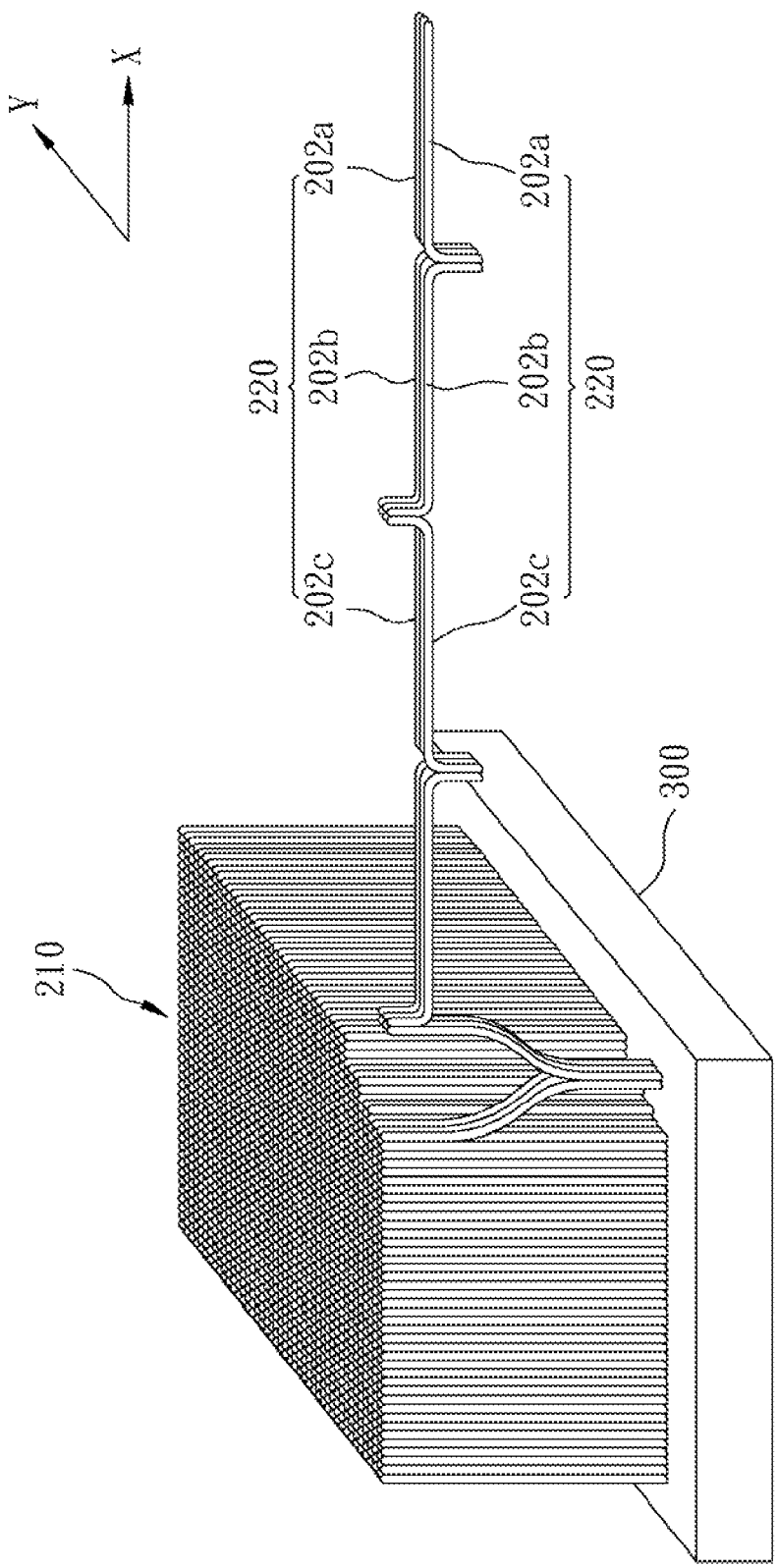
FIG. 1B is a perspective view of the exemplary embodiment of the conductive film of the present disclosure, illustrating how strings of interconnected nanounits are stretched along a first direction "X" according to the method of this disclosure.
Figure 1C:
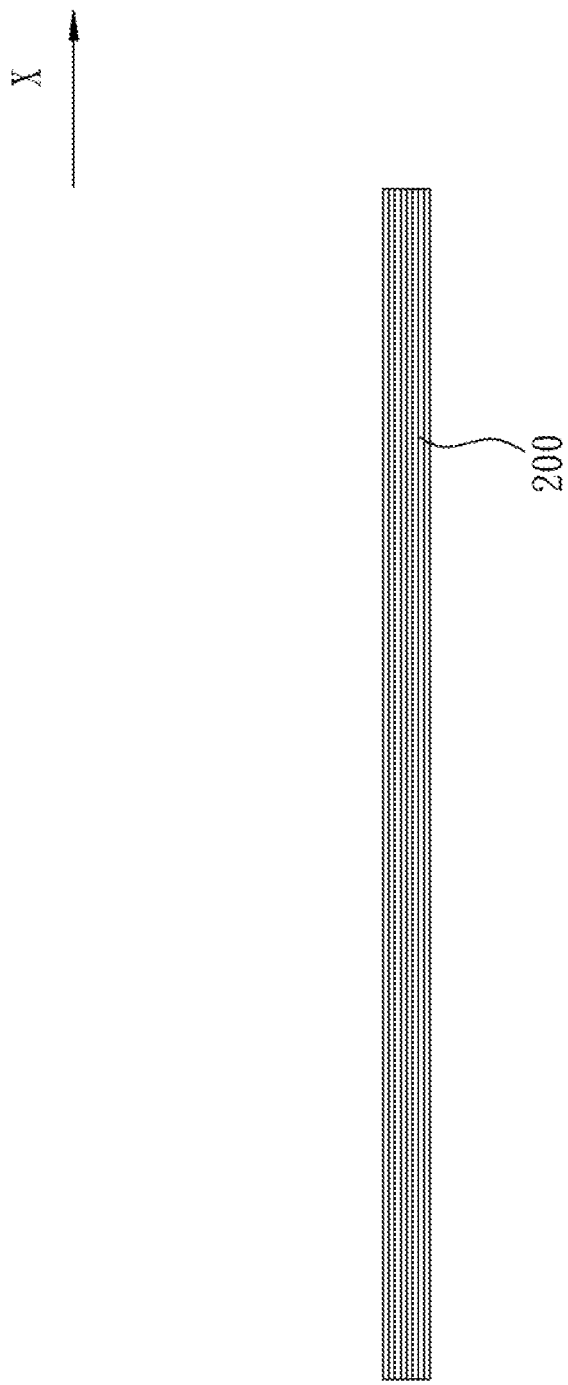
FIG. 1C is a schematic side view with an SEM cross-sectional image illustrating the structure of the conductive film formed according to the method of the present disclosure.

Referring to FIGS. 1A to 1C, the exemplary embodiment of a method for making a conductive film 200 exhibiting electric anisotropy of the present disclosure includes: (A) forming a nanomaterial 210 on a first substrate 300 using a deposition reactor (not shown), the nanomaterial 210 having a cluster of interconnected nanounits 202, each of the nanounits 202 being substantially transverse to the first substrate 300 and having one end bonded to the first substrate 300 (see FIG. 1A); and (B) stretching the nanounits 202 along a first direction "X" to remove the nanomaterial 210 from the first substrate 300 so as to form a conductive film having strings 220 of interconnected nanounits 202, where the nanounits 202 of the strings 220 substantially extend in the first direction "X" (see FIG. 1B) so as to form the conductive film 200 (see FIG. 1C) exhibiting electric anisotropy.

For example, the nanounits 202 are anisotropic in shape. The nanounits 202 can be carbon nanotubes (CNTs), carbon nanotube bundles, or nanoparticles formed by arc discharge techniques, laser vaporization techniques, or chemical vapor deposition (CVD) techniques, for example. The first substrate 300 can be made from silicon, graphite, or quartz, for example.

In more detail, in step (B), for instance, the nanounits 210 include the nanounit 202a, the nanounit 202b, and the nanounit 202c. When the nanounit 202a is stretched along a first direction "X" to remove the nanounits 202a from the first substrate 300, the nanounits 202b, which is adjacent to the nanounit 202a, is also peeled from the first substrate 300 by the nanounit 202a through a Van der Waals' interaction therebetween. In a similar way, the nanounit 202c, which is adjacent to the nanounit 202b, is also peeled from the first substrate 300 by the nanounit 202b through a Van der Waals' interaction therebetween when the nanounit 202b is stretched. As a result of the Van der Waals' interaction, the nanounit 202a, the nanounit 202b, and the nanounit 202c are serially connected to form a string 220 of interconnected nanounits 220. As a consequence, the nanounits 202 on the first substrate 300 can be removed substantially in a row by row manner so as to form strings of interconnected nanounits 220, that consists the conductive film 200 exhibiting electric anisotropy.

In the exemplary embodiment of the method for making the conductive film 200, the second direction "Y" is substantially distinct from the first direction "X" (see FIG. 1B). The conductive film 200 thus formed has the strings 220 of the interconnected nanounits 202 (see FIG. 1C) extending in the first direction "X". It should be understood that "electric anisotropy" used herein may be referred to as "conductive anisotropy" or "resistivity anisotropy", and is a property having different conductivities or resistivities in different directions. In the exemplary embodiment, the conductivity/resistivity of the conductive film 200 in the first direction "X" is higher/lower than the conductivity/resistivity of the conductive film 200 in the second direction "Y".

Figure 1D:
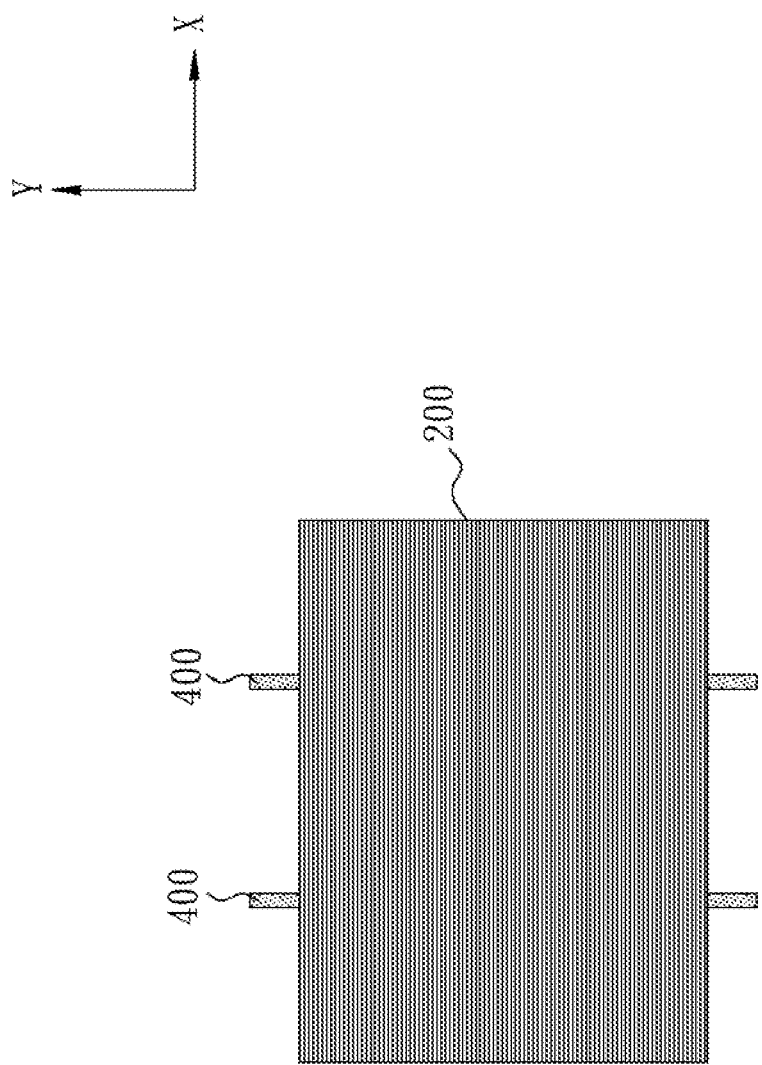
FIG. 1D is a top view of FIG. 1C with an SEM image, illustrating the structure of the conductive film before stretched along a second direction "Y".
Figure 1E:
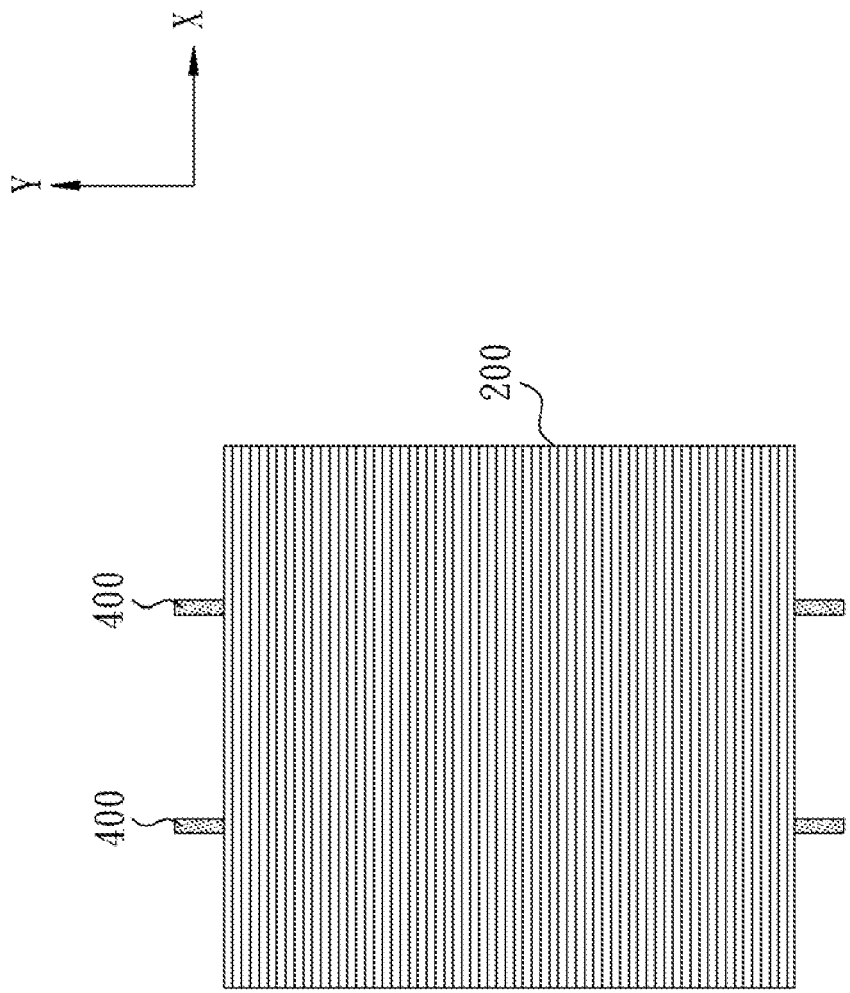
FIG. 1E is a top view of FIG. 1D with an SEM image, illustrating the structure of the conductive film after stretched along the second direction "Y".

The SEM images shown in FIGS. 1D and 1E show that the dimension of the conductive film 200 is expansible in the second direction "Y" by virtue of the structure of the conductive film 200. Hence, in the exemplary embodiment of the method for making the conductive film 200, the method further includes stretching the conductive film 200 formed in step (B) along the second direction "Y" so as to enlarge an area of the conductive film 200 (see FIGS. 1D to 1E) and so as to increase a transmittance of the conductive film 200.

The stretching of the conductive film 200 in the second direction "Y" can be performed by one of mechanical stretching and blowing stretching. For instance, the stretching of the conductive film 200 in the second direction "Y" is performed by mechanical stretching. In an example, the mechanical stretching is conducted by attaching the conductive film 200 to a plurality of elements 400 of an elastic material (see FIGS. 1D and 1E), such as rubber and silica gel, through petroleum jelly or alcohol, applying a tensile stress to the plurality of elastic elements 400 so as to extend the plurality of elastic elements 400 together with the conductive film 200 along the second direction "Y", thereby enlarging the conductive film 200 in the second direction "Y". In the exemplary embodiment of the method for making the conductive film 200, the elastic elements 400 are parallel each other.

For example, the stretching operation in the first direction "X" or the second direction "Y" has a stretching rate ranging from 0.1 cm/sec to 5 cm/sec. In the example, the stretching rate is 0.5 cm/sec.

Figure 2:
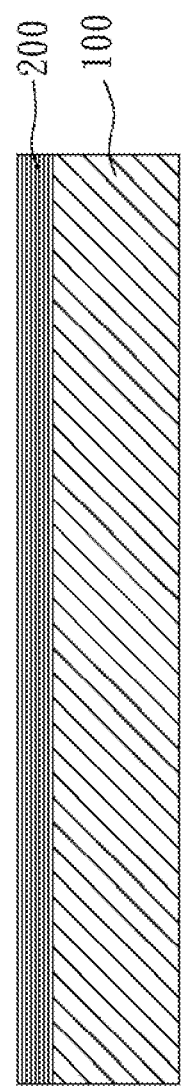
FIG. 2 is a sectional side view of an exemplary embodiment of a conductive plate of the present disclosure.

The exemplary embodiment of a method for making a conductive plate (see FIGS. 1B and 2) of the present disclosure includes (a) stretching a nanomaterial 210 to remove the nanomaterial 210 from a first substrate 300 so as to form the conductive film 200 exhibiting electric anisotropy; and (b) attaching the conductive film 200 to a second substrate 100 so as to form the conductive plate of the exemplary embodiment of present disclosure.

The second substrate 200 can be made from glass or a transparent polymer. For instance, the transparent polymer may be, but is not limited to, polymethyl methacrylate, polyethylene terephthalate, or polycarbonate.

The exemplary embodiment of the method for making the conductive plate further includes thinning the conductive film 200 formed in step (a) by heating the conductive film 200. For example, the heating operation is performed by thermal treatment techniques or laser treatment techniques.

In summary, by forming the cluster of the nanounits 202 on the first substrate 300, followed by converting the cluster of the nanounits 202 to the conductive film 200 through stretching in the first and second directions "X, Y", the deposition reactor required to form the nanomaterial is only required to have a size sufficient to produce the size of the cluster of nanounits 202. Unlike the present disclosure, the deposition reactor of the aforesaid prior art is required to have a size sufficient to produce the size of the ITO conductive film.

It is to be understood that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts, within the principles of the embodiments, to the full extent indicated by the broad general meaning of the terms in which the appended claims are expressed.

What is claimed is:

1. A method for making a conductive film exhibiting electric anisotropy, comprising:
    (A) forming a nanomaterial on a substrate, the nanomaterial having a cluster of interconnected nanounits, each of the nanounits being substantially transverse to the substrate and having one end bonded to the substrate;
    (B) stretching the nanounits along a first direction in a plane of stretching to remove the nanomaterial from the substrate so as to form a conductive film having strings of interconnected nanounits, wherein the nanounits of the strings substantially extend in the first direction; and
    (C) stretching the conductive film formed in step (B) along a second direction so as to enlarge an area of the conductive film and so as to increase a transmittance of the conductive film, wherein the second direction is distinct from the first direction and is perpendicular to the first direction in the plane of stretching, wherein the stretching of the conductive film in the second direction is performed by one of mechanical stretching and blowing stretching.

2. The method of claim 1, wherein the conductive film exhibits electric anisotropy.

3. The method of claim 1, wherein the nanounits are carbon nanotubes, carbon nanotube bundles, or nanoparticles.

4. The method of claim 1, wherein the mechanical stretching is conducted by attaching the conductive film to a plurality of elastic elements and applying a tensile stress to the plurality of elastic elements so as to extend the plurality of elastic elements together with the conductive film along the second direction.

5. The method of claim 1, further comprising thinning the conductive film formed in step (B) by heating the conductive film.

6. A method for making a conductive plate, comprising:
    (a) stretching a nanomaterial in a first direction in a plane of stretching to remove the nanomaterial from a first substrate so as to form a conductive film exhibiting electric anisotropy;
    (b) stretching the conductive film formed in step (a) along a second direction so as to enlarge an area of the conductive film and so as to increase a transmittance of the conductive film, wherein the second direction is distinct from the first direction and is perpendicular to the first direction in the plane of stretching, wherein the stretching of the conductive film in the second direction is performed by one of mechanical stretching and blowing stretching; and
    (c) attaching the conductive film to a second substrate.

7. The method of claim 6, wherein the conductive film has the strings of interconnected nanounits, each of which extends in a first direction along which the nanomaterial is stretched.

8. The method of claim 7, wherein the nanounits are anisotropic in shape.

9. The method of claim 7, wherein the nanounits are carbon nanotubes, carbon nanotube bundles, or nanoparticles.

10. The method of claim 6, wherein the mechanical stretching is conducted by attaching the conductive film to a plurality of elastic elements and applying a tensile stress to the plurality of elastic elements so as to extend the plurality of elastic elements together with the conductive film along the second direction.

11. The method of claim 6, further comprising thinning the conductive film formed in step (a) by heating the conductive film.

\* \* \* \* \*